(12) United States Patent
Song et al.

(10) Patent No.: US 12,238,885 B2
(45) Date of Patent: Feb. 25, 2025

(54) VEHICLE-MOUNTED INVERTER SKID

(71) Applicant: QINGDAO CCS ELECTRIC CORPORATION, Qingdao (CN)

(72) Inventors: Chenglin Song, Qingdao (CN); Xianzhou Sun, Qingdao (CN); Pingping Song, Qingdao (CN); Zheng Ding, Qingdao (CN)

(73) Assignee: QINGDAO CCS ELECTRIC CORPORATION, Qingdao (CN)

( * ) Notice: Subject to any disclaimer, the term of this patent is extended or adjusted under 35 U.S.C. 154(b) by 505 days.

(21) Appl. No.: 17/781,655

(22) PCT Filed: Nov. 16, 2020

(86) PCT No.: PCT/CN2020/128970
§ 371 (c)(1),
(2) Date: Jun. 1, 2022

(87) PCT Pub. No.: WO2022/048021
PCT Pub. Date: Mar. 10, 2022

(65) Prior Publication Data
US 2023/0007803 A1  Jan. 5, 2023

(30) Foreign Application Priority Data

Sep. 1, 2020 (CN) .......................... 202010906023.4

(51) Int. Cl.
*H05K 7/14* (2006.01)
*H02M 5/42* (2006.01)
(Continued)

(52) U.S. Cl.
CPC ............ *H05K 7/1432* (2013.01); *H02M 5/42* (2013.01); *H02M 7/003* (2013.01); *H05K 7/20909* (2013.01)

(58) Field of Classification Search
CPC ...... H02B 7/06; H05K 7/1432; H05K 7/1497; H05K 7/14325; H05K 7/14322;
(Continued)

(56) References Cited

U.S. PATENT DOCUMENTS 9,485,889 B2 * 11/2016 Broussard .......... H05K 7/20509
11,503,746 B2 * 11/2022 Khachaturov ........ F04B 39/066

FOREIGN PATENT DOCUMENTS

CN           203166742 U  *  8/2013
CN           203859672       10/2014
(Continued)

OTHER PUBLICATIONS

CN-211266748-U Translation (Year: 2020).*
CN-203166742-U Translation (Year: 2013).*

*Primary Examiner* — Mandeep S Buttar
*Assistant Examiner* — Matthew Sinclair Muir
(74) *Attorney, Agent, or Firm* — Jiwen Chen; Joywin IP Law PLLC

(57) ABSTRACT

A vehicle-mounted inverter skid wherein the bottom plate of a box body (100) is equipped with a plurality of support beams (105), and the height of the support beams (105) is less than the height of a support frame (104), such that the box body (100) is a sunken structure relative to the support frame (104), and the height dimension of the box body (100) is reduced by it being sunken in the direction of the support frame (104); a wire feed-in assembly of a wire feed-in unit (200) comprises a wire feed-in terminal (202) and a wire feed-in bracket (203); the wire feed-in bracket (203) is shaped like the Chinese character for a door, its top plate is provided with an wire feed-in hole (2031), and the wire feed-in terminal (202) is vertically insertedly disposed in the wire feed-in hole (2031) for fixing; the bottom plate of the box body (100) has a wire feed-in port (204) corresponding to the location of the wire feed-in hole (2031), such that the
(Continued)

wire feed-in terminal (202) is arranged vertically, reducing the horizontal footprint of the wire feed-in assembly; combined with a magnetic excitation assembly (205) of the wire feed-in unit (200) being separated and arranged in the vacant space on the side of a transformer unit (300), the length and width of the inverter sled are reduced, thus reducing the overall volume of the inverter skid, solving the technical problem of the large size of existing inverter sleds and making it more suitable for vehicle-mounted use.

8 Claims, 2 Drawing Sheets

(51) Int. Cl.
*H02M 7/00* (2006.01)
*H05K 7/20* (2006.01)

(58) Field of Classification Search
CPC ...... H05K 7/20909; H05K 7/14; H04Q 1/035; H02M 7/003; H02M 5/42
See application file for complete search history.

(56) References Cited

FOREIGN PATENT DOCUMENTS

| | | | |
|---|---|---|---|
| CN | 205944844 | 2/2017 | |
| CN | 110649859 | 1/2020 | |
| CN | 110913661 | 3/2020 | |
| CN | 210469158 | 5/2020 | |
| CN | 211266748 U * | 8/2020 | |
| JP | H11332217 | 11/1999 | |
| WO | WO-2021058833 A1 * | 4/2021 | ............ H01M 10/60 |

* cited by examiner

VEHICLE-MOUNTED INVERTER SKID

This is a U.S. national stage application of PCT Application No. PCT/CN2020/128970 under 35 U.S.C. 371, filed Nov. 16, 2020 in Chinese, claiming priority to Chinese Patent Applications No. 202010906023.4 filed Sep. 1, 2020, all of which are hereby incorporated by reference.

TECHNICAL FIELD

The present invention relates to the technical field of drilling and extraction equipment, in particular to a vehicle-mounted variable-frequency drive skid.

BACKGROUND TECHNOLOGY

The fracturing pump is powered by a motor driven by a variable-frequency drive (VFD, also known as inverter). To facilitate transportation and on-site installation, in one variable-frequency drive skid, inlet cable unit, power transformer and inverter unit and heat dissipation unit are integrated in one container body. As shown in FIG. 1, an inlet cable unit 2, a power transformation unit 3 and an inverter unit 4 are arranged in a container body 1 in sequence. In addition, an overhead supporting frame 5 is arranged at the bottom of the container body 1, which is configured to support and provide waterproof protection for components in the container body 1.

Although the integrated one-piece structure is convenient for transportation and on-site installation, it has disadvantages of being large in size and unmovable once being placed on site.

SUMMARY OF THE INVENTION

Technical Problem

Therefore, in North American design requirements for oil field fracturing, the inverter skid is required to be suitable for vehicle-mounted condition so as to make it easy to move and increase flexibility of on-site application, but how to reduce the size of inverter skid size to enable it to be loaded on vehicles is the problem to be solved at first.

Technical Solutions

The present invention provides a vehicle-mounted variable-frequency drive skid, aiming at limiting the size of the vehicle-mounted variable-frequency drive skid in the prior art.

In order to solve the above-mentioned technical problems, the present invention adopts the following technical solutions.

A vehicle-mounted variable-frequency drive skid including a container body, in which in sequence a first accommodation space, a second accommodation space and a third accommodation space are divided into; and a supporting frame is connected to the bottom of the container body; an inlet cable unit arranged in the first accommodation space; a power transformation unit arranged in the second accommodation space; and an inverter unit arranged in the third accommodation space; wherein a plurality of supporting beams are installed on a bottom plate of the container body, and the heights of the supporting beams are smaller than the height of the supporting frame so that the container body has a sinking structure relative to the supporting frame; the inlet cable unit includes a high voltage distribution cabinet and an inlet cable component arranged in the first accommodation space; wherein the inlet cable component includes inlet cable terminals and an inlet cable supporting bracket; the inlet cable supporting bracket is in the shape of C opened with inlet cable holes on its top plate; the inlet cable terminals are vertically inserted in the inlet cable holes for fixation; a bottom plate of the container body is opened with inlet cable openings corresponding to the inlet cable holes; and the power transformation unit is arranged in the middle of the second accommodation space and an excitation component of the inlet cable unit is arranged on a side of the power transformation unit arranged in the second accommodation space.

Further, the inlet cable component further includes a first inlet cable guiding plate, the first inlet cable guiding plate is installed under the inlet cable supporting bracket, on which first inlet cable guiding holes are opened corresponding to where the inlet cable holes are opened on the top plate of the inlet cable supporting bracket.

Further, the inlet cable component further includes a second inlet cable guiding plate, the second inlet cable guiding plate is installed above the inlet cable supporting bracket, on which second inlet cable guiding holes are opened corresponding to where the inlet cable holes are opened on the top plate of the inlet cable supporting bracket.

Further, the second accommodation space is provided with a first heat dissipation unit; the first heat dissipation unit includes: first heat dissipation fan cabinets installed on an upper part of the power transformation unit and fixed with a top plate of the container body; an air inlet opened on a lower part of a first side wall of the container body, the first side wall is the opposite side where the excitation component is installed; an air outlet opened on an upper part of a second side wall of the container body, the second side wall is opposite to the first side wall; and an air outlet duct provided among the first cooling fan cabinets and the air outlet for connection.

Further, vibration damping foam is disposed between the first cooling fan cabinets and the power transformation unit.

Further, a second heat dissipation unit for cooling the inverter unit is provided in the third accommodation space, which includes: a second cooling fan cabinet installed on an upper part of the inverter unit with an upward airflow; a heat exchanger arranged in the second cooling fan cabinet; a water-cooling plate installed close to a side of the inverter unit, which includes a water inlet and a water outlet; and a water pipe where water circulates is provided with to connect the water inlet and the water outlet, wherein the water pipe is connected with the heat exchanger.

Further, the inverter unit includes a low voltage component and a high voltage component; the third accommodation space adopts a grid layout, wherein the low voltage component is arranged in one cell while the high voltage component is arranged in another two cells.

Further, the high-voltage component includes a rectifier component, a first inverter component and a second inverter component; wherein the rectifier component is arranged adjacent to the first inverter component, and the second inverter component is adjacent to the first inverter component; the first inverter component and the second inverter component are arranged vertically.

Beneficial Effect

Aiming at reducing size, the vehicle-mounted variable-frequency drive skid disclosed by the present invention adopts multiple techniques: the container body sinks below the supporting frame in order to reduce its height; inlet cable holes are opened on the top plate of the inlet cable supporting bracket and inlet cable openings are opened on the bottom plate of the container body so that the inlet cable terminals could be vertically arranged to reduce the horizontal space occupied by the inlet cable component; the excitation component is disassembled and arranged in empty space on a side of the power transformation unit so that the length and width of the skid could be reduced; with those arrangements the size of the skid is reduced as a whole to make it more suitable for vehicle-mounted conditions.

Further, in the second heat dissipation unit for the cooling of the inverter unit, a lateral air outlet structure in the prior art is upgraded as a upward air outlet structure, which could further reduce the length of the variable-frequency skid and limit the overall size, much more suitable for vehicle-mounted conditions.

Further, in order to make it more suitable for vehicle-mounted conditions, shock absorbing supporting beams are added to an outer side of the bottom plate of the container body to reduce the impact of vehicle body vibration on the skid; the first heat dissipation fan cabinet for cooling the power transformation unit is fixed on the top plate of the container body to reduce the impact caused by the vibration of the fan on the power transformation unit.

In the power transformation unit, the low-voltage component and the high-voltage component are arranged separately, which improves the safety performance of the variable-frequency drive skid during operation.

Figure 1:
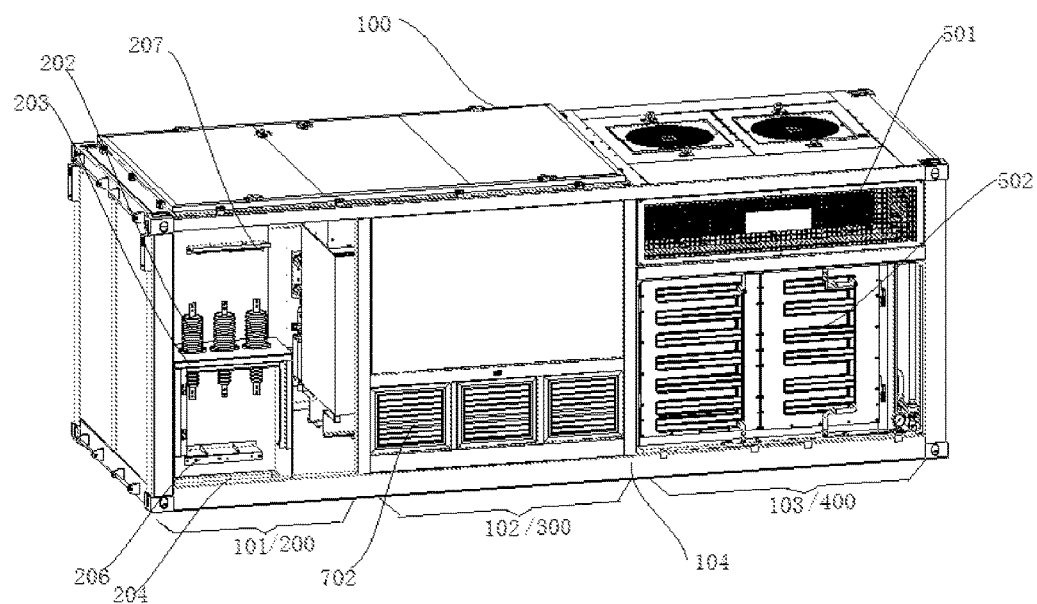
FIG. 1 is a side view of a vehicle-mounted variable-frequency drive skid according to the present invention.

wherein,
100—container body, 101—first accommodation space, 102—second accommodation space, 103—third accommodation space, 104—supporting frame, 105—supporting beam;
200—inlet cable unit, 201—high voltage distribution cabinet, 202—inlet cable terminal, 203—inlet cable supporting bracket, 2031—inlet cable hole, 204—inlet cable opening, 205—excitation component, 206—first inlet cable guiding plate, 207—second inlet cable guiding plate;
300—power transformation unit;
400—inverter unit, 401—low voltage component, 4021—rectifier component, 4022—first inverter component, 4023—second inverter component, 403—variable frequency drive unit, 404—cable outlet unit;
501—second cooling fan cabinet, 502—water-cooling plate;
701—first cooling fan cabinet, 702—air inlet, 703—air outlet, 704—air outlet duct.

DETAILED DESCRIPTION OF THE EMBODIMENTS OF THE PRESENT INVENTION

The specific embodiments of the present invention will be described in further detail below with reference to the accompanying drawings.

To make objects, technical solutions and advantages clearer, embodiments of the present invention will be described in conjunction with the accompanying drawings. Obviously, the described embodiments are merely a part based on the present invention and other embodiments obtained by those of ordinary skill in the art without creative work shall fall within the protection scope of the present invention.

It should be noted that in the description of the present invention, terms 'upper', 'lower', 'left', 'right', 'vertical', 'horizontal', 'inner', 'outer' and the like only indicate directions or positional relationship shown in the drawings, which is only for a clear description and does not indicate or imply that devices or elements must have, or be constructed, or be operated in, a specific orientation, and therefore could not be understood as limitations of the present invention. In addition, the terms 'first' and 'second' are only used for descriptive purposes, and could not be understood as indication or implication of relative importance.

The present invention aims to reduce the size of vehicle-mounted variable-frequency drive skid in the prior art so as to make it suitable for vehicle-mounted working conditions.

Figure 2:
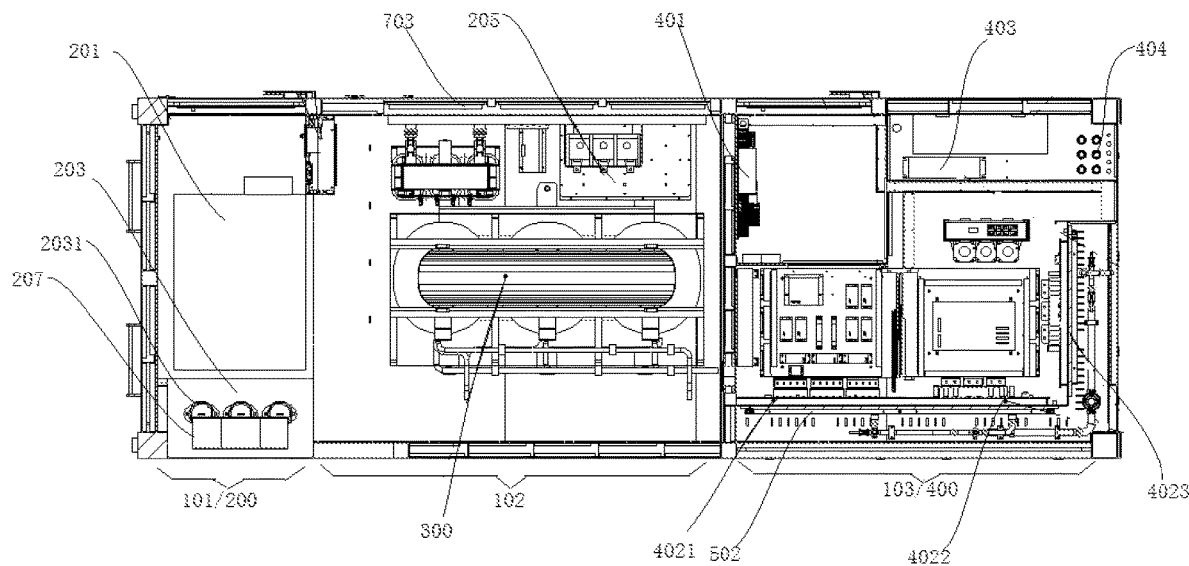
FIG. 2 is a top sectional view of a vehicle-mounted variable-frequency drive skid according to the present invention.
Figure 3:
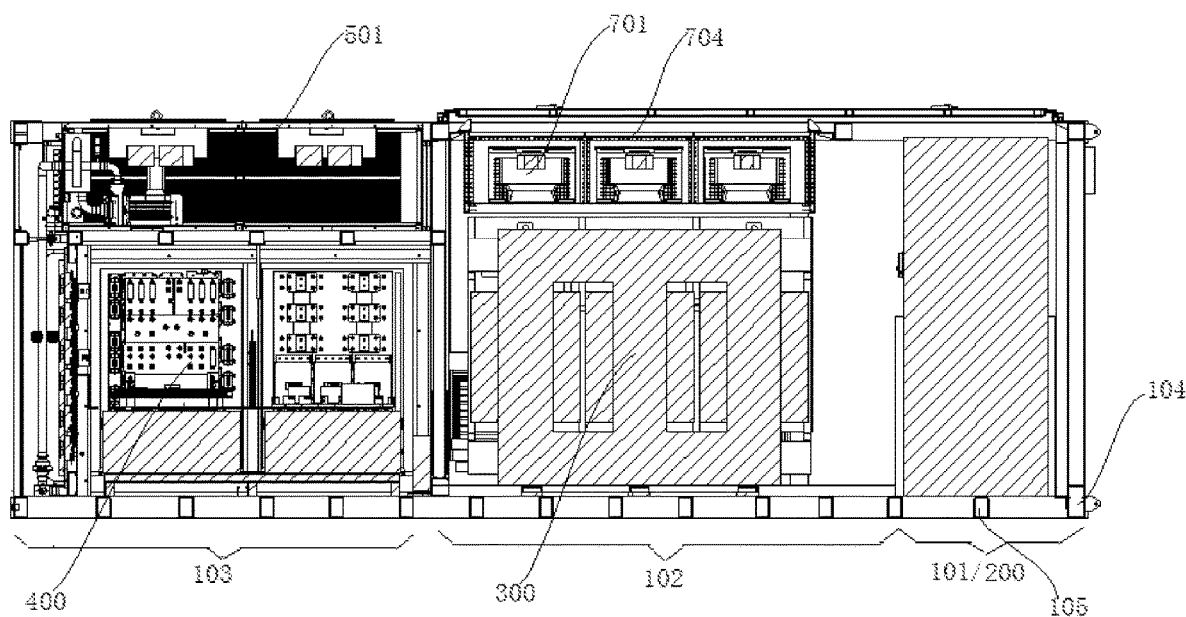
FIG. 3 is a side sectional view of the vehicle-mounted variable-frequency drive skid according to the present invention.

Specifically, as shown in FIG. 1 to FIG. 3, a vehicle-mounted variable-frequency drive skid includes a container body 100, an inlet cable unit 200, a power transformation unit 300 and an inverter unit 400.

The interior of the container body 100 is divided into three accommodation spaces in sequence: a first accommodation space 101, a second accommodation space 102 and a third accommodation space 103; a supporting frame 104 with a set height is connected to the bottom of the container body 100. The inlet cable unit 200 is arranged in the first accommodation space 101, the power transformation unit 300 is arranged in the second accommodation space 102, and the inverter unit 400 is arranged in the third accommodation space 103.

As shown in FIG. 1 and FIG. 3, a plurality of supporting beams 105 are installed on a bottom plate of the container body 100, and the height of each supporting beams 105 are smaller than the set height of the supporting frame 104, so that the container body 100 has a sinking structure relative to the supporting frame 104. With these arrangements, the overall height of the variable-frequency drive skid is reduced vertically, thereby reducing the overall size of the variable-frequency drive skid.

As shown in FIG. 1 and FIG. 2, the inlet cable unit 200 includes a high voltage distribution cabinet 201 and an inlet cable component arranged in the first accommodation space 101, wherein the inlet cable component includes inlet cable terminals 202 and an inlet cable supporting bracket 203; the inlet cable supporting bracket 203 is in the shape of C opened with inlet cable holes 2031 on its top plate; the inlet cable terminals 202 are vertically inserted in the inlet cable holes 2031 for fixation; a bottom plate of the container body 100 is opened with inlet cable openings 204 corresponding to the inlet cable holes 2031.

In variable-frequency drive skid of the prior art, inlet cable terminals are inserted from side of container body of the variable-frequency drive skid along a horizontal direction. Determined by the length of the inlet cable terminal, it has to connect the inlet cable after insertion and add inlet cable steering structures, which occupies much space along the horizontal direction resulting in a larger width of the container body, in the meanwhile vertical space around the inlet cable unit is empty and wasted. But in the present invention, because the inlet cable holes 2031 are opened on the top plate of the inlet cable supporting bracket 203 and inlet cable openings 204 are opened on the bottom of the container body, cables are fed from the bottom of the container body, and the inlet cable terminals 202 could be directly connected with the inlet cables fed in. Compared with the horizontal cable arrangement in the prior art, the vertical fixed inlet cable terminals 202 greatly reduces the space occupied by the inlet cable component horizontally, and further reduces the width of the variable-frequency drive skid horizontally, so the overall size of the variable-frequency drive skid is being limited.

In some embodiments of the present invention, as shown in FIG. 1, the inlet cable component further includes a first inlet cable guiding plate 206 and a second inlet cable guiding plate 207; the first inlet cable guiding plate 206 is installed under the inlet cable supporting bracket 203, on which first inlet cable guiding holes are opened corresponding to where the inlet cable holes 2031 are opened on the top plate of the inlet cable supporting bracket 203; the second inlet cable guiding plate 207 is installed above the inlet cable supporting bracket 203, on which second inlet cable guiding holes are opened corresponding to where the inlet cable holes 2031 are opened on the top plate of the inlet cable supporting bracket 203. The first inlet cable guiding plate 206 and the second inlet cable guiding plate 207 could respectively guide, classify and fix the inlet cables on both of the top side and the bottom side, the inlet cables finally enter the high voltage distribution cabinet 201 from the top side.

In the present invention, as shown in FIG. 2, the excitation component 205 of the inlet cable unit 200 is disassembled and arranged in the second accommodation space 102 independently, thereby reducing the space occupied by the inlet cable unit and minimizing the height of the container body of the variable-frequency drive skid. To be specific, the power transformation unit 300 is arranged in the middle of the second accommodation space 102 longitudinally and the excitation component 205 is arranged on a side of the power transformation unit arranged in the second accommodation space 102.

In the variable-frequency drive skid of the prior art, spaces on both sides of the power transformation unit 300 is empty and wasted, but in the present invention, the excitation component 205 of the inlet cable unit 200 is disassembled and arranged on a side of the power transformation unit 300, so empty spaces around the power transformation unit 300 is used; space that the high voltage distribution cabinet 201 of the inlet cable unit 200 is occupied and the overall length of the variable-frequency drive are limited.

As shown in FIG. 1, in the third accommodation space 103 where the inverter unit 400 is located, a second heat dissipation unit for cooling the inverter unit 400 is provided. The second heat dissipation unit includes a second cooling fan cabinet 501, a heat exchanger and a water-cooling plate 502, wherein the second cooling fan cabinet 501 is installed on an upper part of the inverter unit 400 with an upward airflow, the heat exchanger (not shown in the drawings) is installed in the second cooling fan cabinet 501, and the water-cooling plate 502 is installed close to a side of the inverter unit 400. The water-cooling plate 502 includes a water inlet, a water outlet and a water pipe where water circulates provided with to connect the water inlet and the water outlet, wherein the water pipe is connected with the heat exchanger or penetrates through the heat exchanger. The water pipe and the water-cooling plate are full of water as a medium.

When the second heat dissipation unit starts, water circulates between the water pipe and the water-cooling plate 502 by a water pump. During a process when water flows in the water-cooling plate 502, water at a lower temperature absorbs and takes away heat generated by the inverter unit 400 for cooling, then flowing back to the water pipe after heat exchange. The heat exchanger further removes heat from the heated water and the removed heat is taken away by the second cooling fan cabinet 501 to the ambient. Then water at a higher temperature turns into water at a lower temperature again and the next heat exchange cycle starts.

The second cooling fan cabinet 501 in the present invention is installed on the upper part of the inverter unit 400. Compared with a lateral arrangement of the container body in the prior art, especially in the cooling part for the inverter unit 400, a lateral air outlet structure is upgraded as an upward air outlet structure, which could further reduce the length of the variable-frequency skid and limit the overall size, much more suitable for vehicle-mounted conditions.

In some embodiments of the present invention, as shown in FIG. 1 to FIG. 3, the second accommodation space 102 is provided with a first heat dissipation unit to cool the power transformation unit 300. The first heat dissipation unit includes first heat dissipation fan cabinets 701, an air inlet 702, an air outlet 703 and an air outlet duct 704, wherein the first cooling fan cabinets 701 are installed on an upper part of the power transformation unit 300 and are fixed with a top plate of the container body 100; the air inlet 702 is opened on a lower part of a first side wall of the container body, the first side wall is the opposite side where the excitation component 205 is installed; the air outlet 703 is opened on an upper part of a second side wall of the container body 100, the second side wall is on the same side as where the excitation component 205 is on and is opposite to the first side wall; the air outlet duct 704 is provided among the first cooling fan cabinets 701 and the air outlet 703 for connection.

When the first heat dissipation unit starts, ambient air enters the second accommodation space 102 from the air inlet 702 under the suction of the first cooling fan cabinets 701. The upward airflow removes heat from the power transformation unit 300 to lower its temperature. Heated air after heat exchange with the power transformation unit 300 is discharged through the air outlet duct 704 and the air outlet 703.

In the embodiment of the present invention, the air outlet 703 is located at an upper part of the container body 100, and the air inlet port 702 is located at a lower part of the container body 100, disposed on both sides of the power transformation unit 300 respectively, so air could flow into from the bottom part of the container body and moves upwards during which heat could be fully removed from the power transformation unit 300 and the cooling efficiency could be improved.

Optionally, the air inlet 702 and the air outlet 703 are provided with rain-proof shutters 620 to prevent external miscellaneous from entering the second accommodation space 102.

Rather than being fixed on the upper part of the power transformation unit 300 in the prior art, the first cooling fan cabinets 701 according to the present invention are fixed on the top plate of the container body 100. Therefore, vibration generated during the work of the first cooling fan cabinet 701 for heat dissipation will not affect the power transformation unit 300 because the power transformation unit 300 is relatively independent with each first cooling fan cabinet 701. Moreover, vibration damping foam is preferably disposed between the first cooling fan cabinets 701 and the power transformation unit 300 to avoid collisions on the power transformation unit 300 caused by the first cooling fan cabinets 701 vibrated greatly, especially where only a narrow gap is formed. The vibration damping foam could be in a shape of ring and disposed on a side of each first cooling fan cabinet 701 or in a shape of strip and disposed on a casing of each first cooling fan cabinet 701 at intervals.

In some embodiments of the present invention, as shown in FIG. 2, the inverter unit 400 includes a low voltage component 401 and a high voltage component; the third accommodation space 103 adopts a grid layout, wherein the low voltage component 401 is arranged in one cell while the high voltage component is arranged in another two cells. The layout could separate the high voltage component from the low voltage component and provide a safety protection for operators.

Specifically, the high-voltage component includes a rectifier component 4021, a first inverter component 4022 and a second inverter component 4023; wherein the rectifier component 4021 is arranged adjacent to the first inverter component 4022, and the second inverter component 4023 is adjacent to the first inverter component 4023. The first inverter component 4022 and the second inverter component 4023 are arranged vertically from top to bottom.

A variable frequency drive unit 403 configured to drive the fan and the water pump in the second heat dissipation unit and a cable outlet unit 404 are further disposed in the third accommodation space 103.

It should be noted that the above description is not intended to limit the present invention, and the present invention is not limited to the above described embodiments. Changes, modifications, additions or substitutions made by those of ordinary skill in the art within the essential scope of the present invention, should also belong to the protection scope of the present invention.

The invention claimed is:

1. A vehicle-mounted variable-frequency drive skid comprising:
a container body, in which in sequence a first accommodation space, a second accommodation space and a third accommodation space are divided into; and a supporting frame
is connected to the bottom of the container body;
an inlet cable unit arranged in the first accommodation space;
a power transformation unit arranged in the second accommodation space; and
an inverter unit arranged in the third accommodation space;
wherein,
a plurality of supporting beams are installed on a bottom plate of the container body, and the heights of the supporting beams are smaller than the height of the supporting frame so that the container body has a sinking structure relative to the supporting frame;
the inlet cable unit comprises a high voltage distribution cabinet and an inlet cable component arranged in the first accommodation space; wherein the inlet cable component comprises inlet cable terminals and an inlet cable supporting bracket; the inlet cable supporting bracket is in the shape of C opened with inlet cable holes on its top plate; the inlet cable terminals are vertically inserted in the inlet cable holes for fixation; the bottom plate of the container body is opened with inlet cable openings corresponding to the inlet cable holes; and
the power transformation unit is arranged in the middle of the second accommodation space and an excitation component of the inlet cable unit is arranged on a side of the power transformation unit arranged in the second accommodation space.

2. The vehicle-mounted variable-frequency drive skid according to claim 1, wherein the inlet cable component further comprises a first inlet cable guiding plate, the first inlet cable guiding plate is installed under the inlet cable supporting bracket, on which first inlet cable guiding holes are opened corresponding to where the inlet cable holes are opened on the top plate of the inlet cable supporting bracket.

3. The vehicle-mounted variable-frequency drive skid according to claim 1, wherein the inlet cable component further comprises a second inlet cable guiding plate, the second inlet cable guiding plate is installed above the inlet cable supporting bracket, on which second inlet cable guiding holes are opened corresponding to where the inlet cable holes are opened on the top plate of the inlet cable supporting bracket.

4. The vehicle-mounted variable-frequency drive skid according to claim 1, wherein the second accommodation space is provided with a first heat dissipation unit;
the first heat dissipation unit comprises:
first heat dissipation fan cabinets installed on an upper part of the power transformation unit and fixed with a top plate of the container body;
an air inlet opened on a lower part of a first side wall of the container body, the first side wall is the opposite side where the excitation component is installed;
an air outlet opened on an upper part of a second side wall of the container body, the second side wall is opposite to the first side wall; and
an air outlet duct provided among the first cooling fan cabinets and the air outlet for connection.

5. The vehicle-mounted variable-frequency drive skid according to claim 4, vibration damping foam is disposed between the first cooling fan cabinets and the power transformation unit.

6. The vehicle-mounted variable-frequency drive skid according to claim 1, wherein a second heat dissipation unit for cooling the inverter unit is provided in the third accommodation space, which comprises:
a second cooling fan cabinet installed on an upper part of the inverter unit with an upward airflow;
a heat exchanger arranged in the second cooling fan cabinet;
a water-cooling plate installed close to a side of the inverter unit, which comprises a water inlet and a water outlet; and a water pipe where water circulates is provided with to connect the water inlet and the water outlet, wherein the water pipe is connected with the heat exchanger.

7. The vehicle-mounted variable-frequency drive skid according to claim 1, wherein the inverter unit comprises a low voltage component and a high voltage component; the third accommodation space adopts a grid layout, wherein the low voltage component is arranged in one cell while the high voltage component is arranged in another two cells.

8. The vehicle-mounted variable-frequency drive skid according to claim 7, wherein the high-voltage component comprises a rectifier component, a first inverter component and a second inverter component; wherein the rectifier component is arranged adjacent to the first inverter component, and the second inverter component is adjacent to the first inverter component; the first inverter component and the second inverter component are arranged vertically from top to bottom.

* * * * *